United States Patent [19]

McLaughlin

[11] 4,289,980
[45] Sep. 15, 1981

[54] TOUCH SENSITIVE ELECTRIC SWITCH

[76] Inventor: Richard J. McLaughlin, 4203 W. 141st St., Hawthorne, Calif. 90250

[21] Appl. No.: 51,430

[22] Filed: Jun. 22, 1979

[51] Int. Cl.³ .................... H03K 3/26; G08B 13/26
[52] U.S. Cl. .................... 307/308; 307/247 R; 307/273; 328/5; 340/669
[58] Field of Search ............ 307/308, 273, 116, 247; 328/5; 200/DIG. 1; 340/669

[56] References Cited

U.S. PATENT DOCUMENTS

| | | | |
|---|---|---|---|
| 3,743,865 | 7/1973 | Riechmann | 328/5 |
| 3,862,441 | 1/1975 | Nabetani et al. | 307/273 |
| 4,112,379 | 9/1978 | Schmidt | 328/5 |
| 4,152,629 | 5/1979 | Raupp | 200/DIG. 1 |

Primary Examiner—Stanley D. Miller, Jr.
Assistant Examiner—B. P. Davis
Attorney, Agent, or Firm—Fulwider, Patton, Rieber, Lee & Utecht

[57] ABSTRACT

An electronic switch has a sensor input responsive to a person's touch. Manual contact is sensed by a CMOS input of a one-shot multivibrator initiating the output which is used to toggle a flip-flop circuit off or on. The flip-flop output is connected to the trigger circuit of a silicon controlled rectifier, which in turn completes a circuit through a load. The switch may be a single pole, single throw switch, or if flip-flops are connected together in cascaded arrangement, a three position switch is formed.

7 Claims, 4 Drawing Figures

TOUCH SENSITIVE ELECTRIC SWITCH

BACKGROUND OF THE INVENTION

1. Field of the Invention

The present invention relates to touch sensitive electric switch circuits.

2. Description of the Prior Art

Touch sensitive electric switch circuits have been sold commercially, typically for use in controlling the operation of electric lights. In conventional circuits of this type an alternating current power source is connected in series with a current load, such as a light filament, and also in series with a switching element. This switching element may take the form of a triac or an SCR. Touch sensitive light switches are frequently used in association with containers for house plants, so that an individual can turn a light off and on where a touch sensitive plate for actuating the light lies in contact with the potting soil in which the plant grows. Conventional touch sensitive switch arrangements typically include a capacitive bias to the base of a transistor or to the grid of a voltage multiplying tube. A person touching a sensor plate electrically connected to a very low voltage biasing capacitor allows the small capacitor charge to disipate through his body to ground. This removes the reverse bias to allow a transistor to conduct a gating current to the triac or silicon controlled rectifier. Once the triac or silicon controlled rectifier has been gated, an open circuit condition no longer exists and current is allowed to flow from the current source through the load.

SUMMARY OF THE INVENTION

The present invention improves upon prior arrangements for touch sensitive electric switches by employing solid state circuit elements in a unique arrangement. Heretofore, gating signals to a series connected switch have been provided by transistor or amplifying tube outputs. According to the present invention, a flip-flop circuit is employed with one output connected as a triggering input to a semiconductor element, such as a silicon controller rectifier or a triac. The flip-flop is toggled to generate or remove a triggering signal with each successive actuation by manual touch of a sensor element. The actual input to the flip-flop circuit is preferably from a one-shot multivibrator, which supplies pulses of predetermined amplitude and duration. The multivibrator is biased to a level that just barely suppresses pulse generation. A charge storage device, such as a capacitor is included in the biasing arrangement and at least partially supplies the pulse suppressing bias and filters out extraneous electrical noise. When a sensor plate or other conductor is touched, the CMOS one-shot senses the static charge on the body and generates a pulse output to the flip-flop. The flip-flop is toggled to reverse the condition at the trigger or gate of a second silicon controlled rectifier. This invention does not use the body contact for a conductive path for current flow.

To form a three position switch, two flip-flop circuits are connected in cascaded arrangement. That is, the pulse generator is connected as one input to a flip-flop. One output of the flip-flop is connected to the gate of a silicon controlled rectifier, while the other output is connected as a toggling input to itself, and also as an input to another flip-flop. The second flip-flop as one output connected to the gate of a second controlled rectifier. The other output of the second flip-flop is connected in a loop as a steering input to itself. Four discrete conditions are thereby obtainable with respect to the first and second silicon controlled rectifiers. That is, both SCRs may be off, the first may off and the second on, the second may be on and first off, or both may be on. Sequential actuation of the touch sensitive sensor element will cycle the switching circuit through all of these conditions.

The invention may be described with greater clarity and particularity by reference to the accompanying drawings.

DESCRIPTION OF THE EMBODIMENTS

Figure 1:
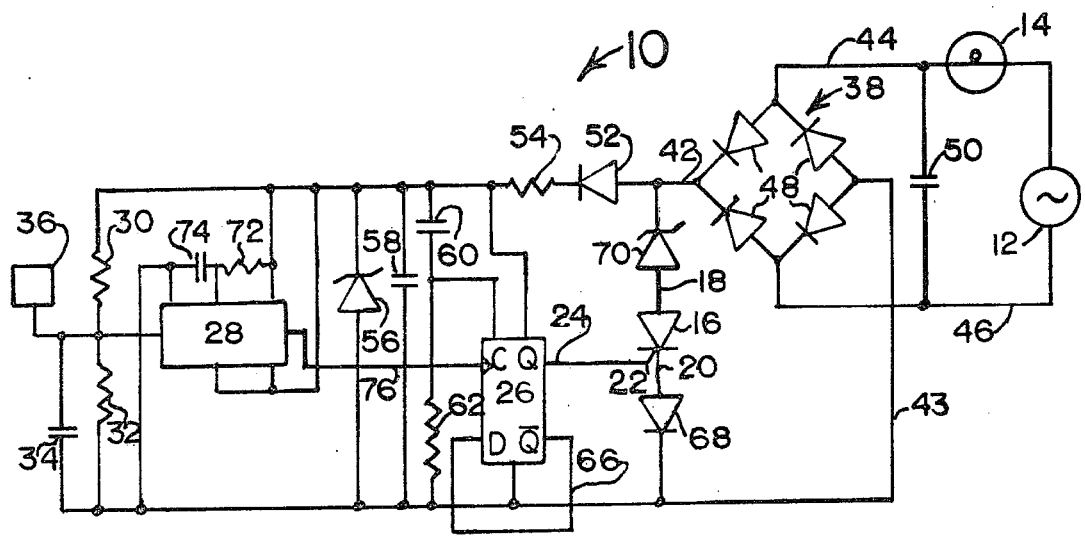
FIG. 1 is a schematic diagram of one embodiment of a single pole, single throw switching circuit according to the invention.

With reference to FIG. 1 a touch sensitive electric switch circuit 10 is illustrated connected in circuit with an alternating current power source 12, which is standard 110-120 volts of 60 cycle alternating current, as supplied by commercial electrical utilities. In the embodiment of FIG. 1 the a.c. power source 12 is connected in series with an alternating current load 14, which may be the filament of a lamp. The switching circuit 10 includes a semiconductor element, such as the silicon controlled rectifier 16 that has a relatively large voltage and current on the anode lead 18 and low voltage on the cathode lead 20 and also a relatively low voltage, low current gating or triggering input lead 22. The SCR 16 conducts d.c. current from input lead 18 to output lead 20 in response to signals on the trigger input lead 22. The trigger input lead 22 is coupled to the Q output line 24 of a flip-flop 26. An electronic sensing device, such as a one shot multivibrator 28 is connected with its output coupled to the clock input of the flip-flop 26. The one shot multivibrator 28 is reverse biased to just suppress pulse generation by a voltage dividing network formed by resistors 30 and 32, and by a capacitor 34 for filtering. A conductive touch plate sensor element 36 is electrically connected to a voltage tap of the voltage network formed between the resistors 30 and 32 and to the capacitor 34. A rectifying bridge 38 is coupled in series with the alternating current source 12 and has output leads 40 and 42 for supplying direct current power to the solid state switching components, and also for driving the silicon controlled rectifier to complete the circuit to allow a.c. current to flow through the filament of the lamp 14.

In the embodiment of FIG. 1 the load 14 is an alternating current load and is series connected with the a.c. power source as is customary in connection with most household electrical appliances. Electrical leads 44 and 46 are connected to inputs to the rectifying bridge 38 formed with four rectifying diodes 48 as illustrated. A high frequency a.c. filtering capacitor 50 is connected across the leads 44 and 46 to smooth spurious, high frequency oscillations, (noise) but allow the 60 hertz signals on lines 44 and 46 to pass to the inputs of the rectifying bridge 38.

The outputs 42 and 43 of the rectifying bridge 38 are connected in two loops. One of the loops is a direct current power supply return for the one shot multivibrator 28, the biasing resistors 30 and 32, the storage capacitor 34, and the flip-flop 26. The second loop includes a blocking diode 52 and a current limiting resistor 54. The voltage dividing network formed by the resistors 30 and 32 is connected across the output lines 42 and 43 of the rectifying bridge 38 through blocking diode 52 and current limiting resistor 54. The blocking diode 52 inhibits current from flowing back to the SCR 16 when it is turned ON so the lower voltage on the anode does not cause the voltage source of the switching circuit to dip below the operating level of the logic devices. A ten volt zener diode 56 is used to clamp the input d.c. voltage supply at ten volts to avoid an overvoltage condition from occuring and maintain a constant supply voltage. An initializing RC network formed by the capacitors 58 and 60 and the resistor 62 is coupled to the reset input of the flip-flop 26 to insure an initial startup (reset) condition when power is first applied to the system. The Q output lead 24 of the flip-flop 26 is coupled to the trigger line 22 of the SCR 16. The $\overline{Q}$ output 66 of the flip-flop 26 is coupled in a loop to the D input of that same flip-flop as a steering input control.

In a parallel loop, the SCR 16 is coupled in series with a rectifying diode 68 and also a zener diode 70. The zener diode 70 is utilized to prevent short-circuiting of the d.c. power supply loop when the SCR 16 is conducting. The zener diode 70 maintains a 10 volt differential between the rectifier output leads 42 and 43 and has a zener breakdown current of one ampere.

The electronic touch circuit of the invention operates on the static potential, existing on a person's body, by sensing the impulse generated when the sensor plate 36 is touched. The sensor plate 36 may be a plate designed for direct contact by the fingers of a human being, but also may merely be in contact with soil in which a house plant is planted. Due to the necessary moisture within the soil, the sensor 36 will be activated when an individual touches the leaves, stems, flowers or soil of the plant.

The sensor plate 36 is connected to the actuating input of the one shot multivibrator 28. The one shot multivibrator output pulse width is set with an external resistor 72 and capacitor 74 to obtain a pulse output on line 76. This pulse is used as a clock pulse to the flip flop 26, which latches the flip-flop 26 with the Q output 24 high. The Q output 24 of the flip-flop 26 is coupled to the gate or trigger lead 22 of the silicon controlled rectifier 16. Once the sensor plate 36 has been touched, the SCR 16 will remain conductive as long as the flip-flop remains latched, thereby completing the circuit through the rectifying bridge 38 and causing the lamp 14 to remain illuminated. When the sensor plate 36 is touched again, or otherwise actuated, the one shot multivibrator 28 will again generate a pulse to switch the Q output 24 of the flip-flop 26 low. This removes the trigger input on line 22 to the SCR, reduces the current through the rectifying network 38, and extinguishes the light 14. Minimum current then flows through the blocking diode 52 to maintain the d.c. voltage required to operate the switching circuit.

Figure 2:
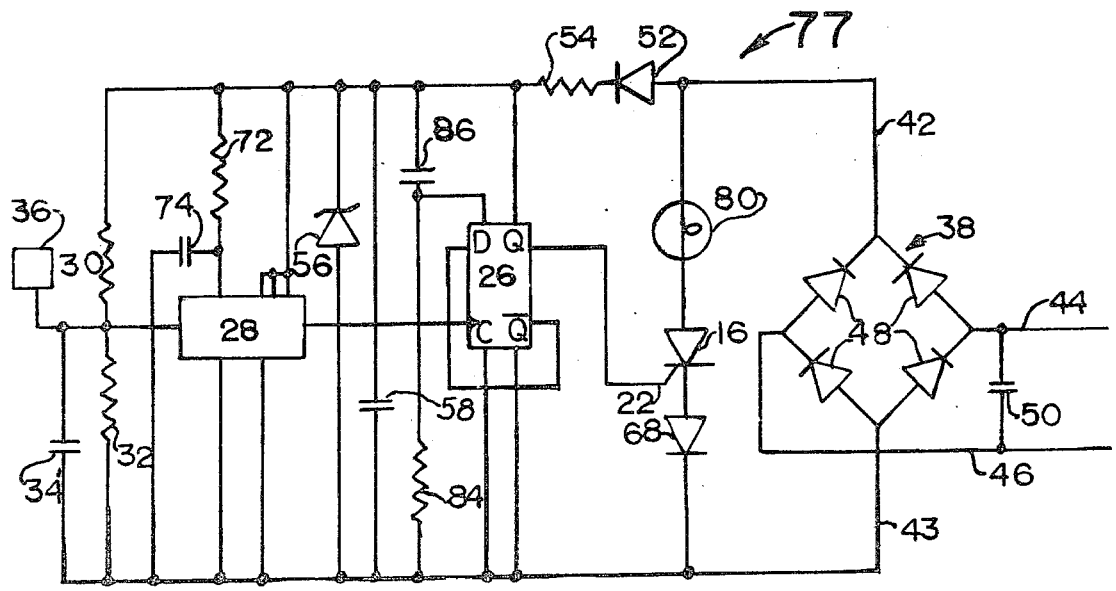
FIG. 2 illustrates an alternative embodiment of the invention as applied to a d.c. load.

The embodiment of FIG. 2 is a single pole, single throw switch 77 similar to that of FIG. 1, and corresponding circuit components have been labelled identically therein. One significant difference of the light switch of FIG. 2 is that the load is not an alternating current load, as employed in the embodiment of FIG. 1, but rather is a d.c. load. The light 80, therefore, is a filament light. The a.c. power source leads 44 and 46 are connected in series with inputs to the rectifying bridge 38. The silicon controlled rectifier 16 and the load 80 are connected in series with each other in a loop connected to the outputs 42 and 43 of the rectifying bridge 38. A parallel d.c. power supply loop is connected to the rectifying bridge outputs 42 and 43 to supply power to the electronic flip-flop circuit 26, the electronic one shot multivibrator 28, the biasing resistors 30 and 32, and the storage capacitor 34'. With the exception of the provision of d.c. power to the load 80, and the elimination of the zener diode 70 due to the presence of the load 80 in series with the SCR 16, the circuit of FIG. 2 functions in exactly the same manner as the circuit of FIG. 1.

Figure 3:
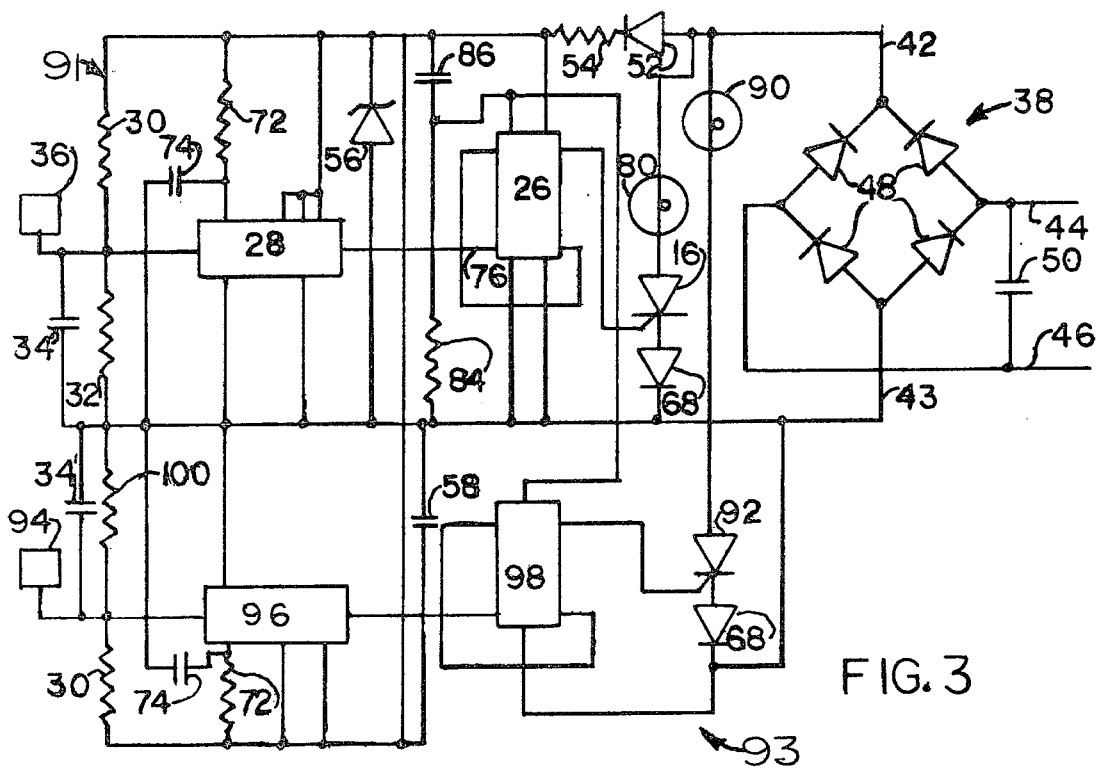
FIG. 3 illustrates a dual switching arrangement employing two sensor elements.

The embodiment of FIG. 3 is somewhat different from that of FIG. 2 in that dual loads 80 and 90 and dual silicon controlled rectifiers 16 and 92 are provided in separate parallel loops, both connected to the outputs 42 and 43 of the rectifying bridge 38. A pair of touch plates 36 and 94 are provided. The touch plate 36 is connected to the one shot multivibrator 28 and the flip-flop circuit 26 in the manner previously described. Similarly, the touch plate 94 is connected to a duplicate one shot multivibrator 96 and a duplicate flip-flop circuit 98. Also, biasing resistors 100 and 102 are provided, along with a capacitor 104, to form a separate biasing network for the multivibrator 96 associated with the touch plate 94.

In the embodiment of FIG. 3, two different electric lights 80 and 90 can be turned off and on, wholly independent of each other, by separate switch circuits 91 and 93 upon the separate actuation of the touch plate 36 and touch plate 94. That is, tactile contact with the touch plate 36 will control the silicon controlled rectifier 16, which in turn controls illumination of the lamp 80, regardless of the condition of the touch plate 94. Similarly, contact with the touch plate 94 controls conduction of direct current by the silicon controlled rectifier 92, and hence illumination of the lamp 90 totally independent of the state of the lamp 80.

Figure 4:
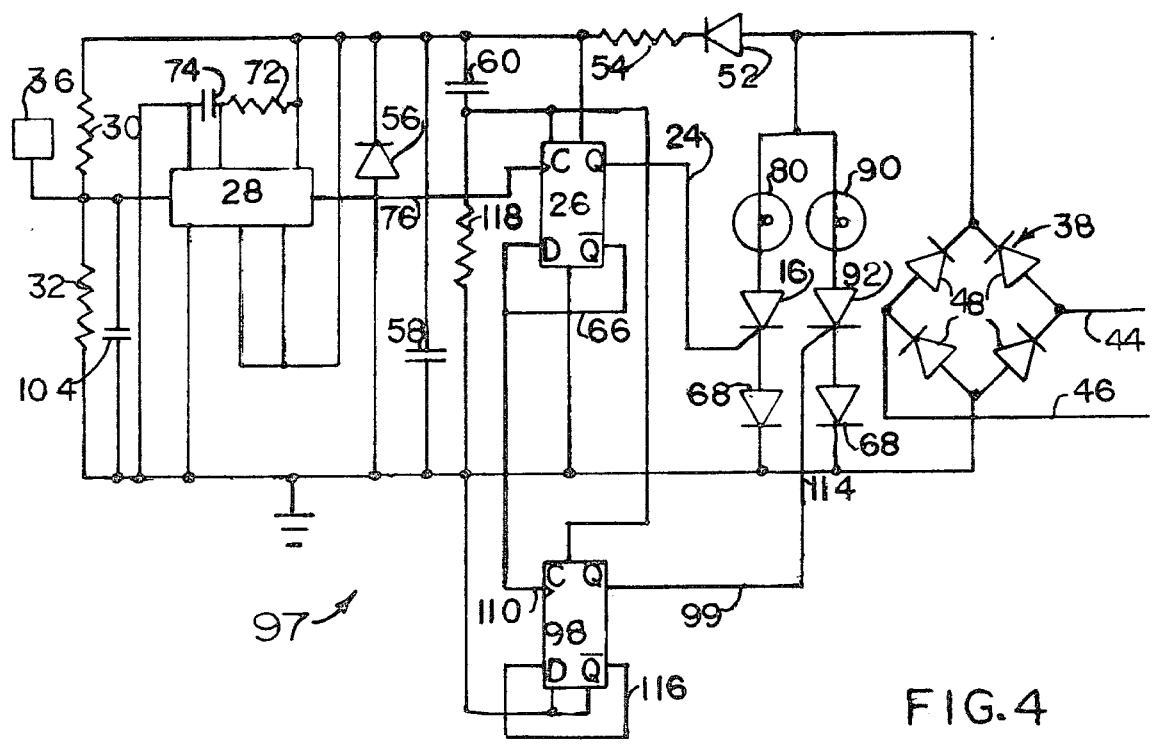
FIG. 4 illustrates a cascaded switching arrangement employing two d.c. load elements.

The touch sensitive switch three way switch 97 of FIG. 4 is somewhat different from the other embodiments. The lamps 80 and 90 are connected in series, respectively, with the SCRs 16 and 92, as in the embodiment of FIG. 3. However, the flip-flops 26 and 98 are connected somewhat differently, and only a single one shot multivibrator 28 and touch plate 36 are employed. The flip-flop 26 has one output connected to the trigger input lead 22 of the SCR 16. The $\overline{Q}$ output of the flip-flop 26 is connected in a loop to a toggle input 108 to the D lead of the flip-flop circuit 26, and also to the Clock input at 110 to the flip-flop 98. The output 99 of the flip-flop 98 is connected to the input 114 of the silicon controlled rectifier 92. The $\overline{Q}$ output 116 of the flip-flop 98 is connected in a loop to the D input of the same flip-flop 98.

In the embodiment of FIG. 4, the switch 97 of the invention is used as a touch sensitive electric switch for a three-way filament bulb. Although the lamps 80 and 90 are indicated as separate entities, they may well be separate filaments within a single bulb envelope.

When the touch plate 36 is first manually contacted, the static charge is sensed from contact of the body of the individual touching the touch plate 36. The sensor plate 36 is connected to the input of the one shot circuit 28 that is biased at a critical point of the one shot sensing level. Contact with the touch plate 36 induces a pulse to the one shot 28, so that it generates a pulse on line 76 to the flip-flop 26. The Q output 24 of the flip-flop 26 goes high driving the triggering gate 22 of the SCR 16. The SCR 16 therefore conducts current through the lamp filament 80 until the rectified voltage on the anode of the SCR 16 dips below the gate trigger voltage. The SCR 16 will come back on again when the voltage again rises to the gate voltage level since the state of the trigger input line 22 does not change.

When the touch plate 36 is contacted again, the one shot 28 again pulses the flip-flop 26. The flip-flop 26 is clocked a second time, so that the $\overline{Q}$ output line 66 goes high and toggles the clock input of the flip-flop 98. This causes the Q output 99 of the flip-flop 98 to go high to cause the SCR 92 to conduct and to illuminate the lamp filament 90. Meanwhile, the change of state of the flip-flop 26 has switched the Q output lead 24 from high to low, extinguishing the lamp filament 80.

A third touch to the sensor plate 36 causes the lamp 80 to illuminate again. Since the Q output 24 of the flip-flop 26 again goes high. The flip-flop 98 remains on, however, with the Q output 99 thereof remaining in a conductive state since the signal on line 66 is low. A fourth touch to the sensor plate 36 will toggle both flip-flops 26 and 98, causing both of the lamps 80 and 90 to go off, thereby competing the cyclic operation of the switch.

Any number of lamps may be energized utilizing the circuit of the present invention. A single circuit can be used as a wall switch in homes of industry. The semiconductor device with a trigger input may be silicon controlled rectifier, as envisioned, or alternatively a triac. The triac will operate on standard a.c. voltages and can be controlled to turn on at different levels of voltages. By applying different voltage potentials to the gate of the triac, the intensity of illumination of a single lamp can be controlled to give any number or variations of output levels.

While several embodiments of the invention have been depicted herein, undoubtedly numerous other variations and modifications to the invention will become readily apparent based on the teachings herein to those familiar with electric light switches. Accordingly, the scope of the invention should not be construed as limited to the specific embodiments depicted and described, but rather as defined in the scope of the claims appended hereto.

Preferred resistance and capacitance values, and electronic component code designations are set forth in Appendix A.

APPENDIX A

One Shot Multivibrator 28, 96-MC14528
flip flop circuits 26, 98-CD4013
Silicon controlled rectifiers 16, 92-T1C106
Rectifying diodes 48,52,68-1N4004
Zener diodes 56,70-10V, 1 ampere

RESISTORS 30,72-1-megohom
32-820 K ohms
54-10 K ohms
62-39 K ohms
84-120 ohms
118-59 K ohms

CAPACITORS

34— 0.1 microfarad
34'— 0.01 "
50— 0.1 "
58— 100 "
60— 1 "
74— 0.47 "
86— 0.47 "
104— 4700 picofarads

I claim:

1. A touch sensitive electric switch for connection in circuit with an alternating current power source and a current load comprising:
   semiconductor means with a trigger input lead for connecting load current responsive to signals on said trigger input lead,
   electronic flip-flop means with an output connected to said trigger input lead,
   electronic one shot multivibrator sensing means having an output connected to an input of said flip-flop for generating an electronic pulse to said flip-flop means in response to an actuating input thereto,
   biasing means including a voltage dividing network for maintaining a steady d.c. bias to said sensing means to suppress pulse generation and including charge storage means connected to said sensing means, to at least partially filter noise,
   conductive touch plate means connected to said sensing means for removing said suppressing bias in response to a manual touch to said touch plate, and
   rectifying means connected to said alternating current power source to supply direct current for operating said electronic flip-flop means, said electronic sensing means and said biasing means.

2. An electric switch according to claim 1 further characterized in that said semiconductor means is a silicon controlled rectifier.

3. An electric switch according to claim 1 further characterized in that said load is an alternating current load and said load and said power source are connected in series with inputs to said rectifying means, said semiconductor means is connected in a loop to outputs of said rectifying means, and a parallel d.c. power supply loop is connected to said outputs of said rectifying means to supply power to said electronic flip-flop means, said electronic sensing means and said biasing means, and a current limiting means is connected to said outputs of said rectifying means to prevent short circuiting of said d.c. power supply loop.

4. An electric switch according to claim 2 further characterized in that said power source is connected in series with inputs to said rectifying means, said semiconductor means and said load are connected in series with each other in a loop connected to outputs of said rectifying means, and a parallel d.c. power supply loop is connected to said outputs of said rectifying means to supply power to said electronic flip-flop means, said electronic sensing means and said biasing means.

5. An electric switch according to claim 1 further comprising dual loads and dual semiconductor means connected in separate parallel loops to said outputs of said rectifying means, and further comprising dual conductive touch plate means, dual biasing means, dual electronic sensing means and dual electronic flip-flop means connected to parallel d.c. power supply loops to separately trigger said dual semiconductor means.

6. An electric switch according to claim 1 further comprising first and second loads and first and second semiconductor means series connected in corresponding fashion thereto in separate parallel loops to said outputs of said rectifying means, and further characterized in that said electronic flip-flop means includes first and second flip-flop circuits, and said first flip-flop circuit has one output connected to the trigger input lead of said first semiconductor means and the other output connected in a loop to toggle inputs to both said first and second flip-flop circuits, and one output of said second flip-flop circuit is connected to the trigger input of said second semiconductor means, and the other output of said second flip-flop means is connected in a loop to another input to itself.

7. An electric switch according to claim 1 further characterized in that said sensing means is a CMOS one-shot multivibrator connected to a voltage tap in said voltage dividing network, to said charge storage means, and to an output of said rectifying means.

* * * * *